United States Patent [19]
Dodabalapur et al.

[11] Patent Number: 5,405,710
[45] Date of Patent: Apr. 11, 1995

[54] ARTICLE COMPRISING MICROCAVITY LIGHT SOURCES

[75] Inventors: Ananth Dodabalapur, North Brunswick; Timothy M. Miller, New Providence; Lewis J. Rothberg, Morristown, all of N.J.

[73] Assignee: AT&T Corp., Murray Hill, N.J.

[21] Appl. No.: 156,217

[22] Filed: Nov. 22, 1993

[51] Int. Cl.⁶ .................................... H05B 33/12
[52] U.S. Cl. .................... 428/690; 428/917; 313/503; 313/504; 313/505; 313/506; 313/507; 313/508; 313/509; 359/838; 385/47; 385/131
[58] Field of Search ................ 428/690, 917; 313/503–509; 359/838; 385/47, 131

[56] References Cited
PUBLICATIONS

H. Yokoyama "Physics and Device Applications of Optical Microcavities" *Science*, vol. 256, pp. 66–70 (1992).
Y. Yamamoto "Optical Processes In Microcavities" *Physics Today*, pp. 66–73 (1993).
K. Murata, "Developers Continue to Refine Blue LED Technologies for Display Use" *Display Devices*, pp. 47–50 (1992).
N. Takada et al. "Control of emission characteristics in organic thin–film electroluminescent diodes using an optical–microcavity structure" *Appl. Phys. Lett.*, vol. 63 (15) pp. 2032–2034 (1993).
T. Nakayama, et al. "Organic photo- and electroluminescent devices with doouble mirrors" *Appl. Phys. Lett.*, vol. 65 (5), pp. 594–595 (1993).

*Primary Examiner*—Charles R. Nold
*Attorney, Agent, or Firm*—Eugen E. Pacher

[57] ABSTRACT

Apparatus according to the invention comprises at least two optical microcavity light emitters. Each one of the at least two light emitters comprises spaced apart reflectors that define a microcavity, and further comprises organic material that is capable of electro-luminescence (e.g., tris (8-hydroxyquinolinol) aluminum, commonly referred to as "Alq"), and means for applying an electric field across the organic material. One of the at least two microcavities has effective optical length $L_1$, and the other microcavity has effective optical length $L_2 \neq L_1$, with the optical lengths selected such that one of the microcavities emits radiation of a first color (e.g., red), and the other microcavity emits radiation of a second color (e.g., green). In many cases there will be present also a third microcavity that emits radiation of a third color (e.g., blue). In preferred embodiments there is present within the microcavities a filler layer, of thickness selected to provide to a given microcavity the desired optical length. A preferred embodiment of the invention is a full color flat panel display that comprises many pixels, each pixel comprising at least three different microcavity emitters. Other contemplated embodiments are a LED printer, an optical interconnect and an optical fiber communication system.

13 Claims, 2 Drawing Sheets

ARTICLE COMPRISING MICROCAVITY LIGHT SOURCES

FIELD OF THE INVENTION

This invention pertains to microcavity light sources, typically in the form of an array of such light sources, exemplarily embodied in a flat panel display.

BACKGROUND OF THE INVENTION

Optical microcavities are resonators that have at least one dimension (herein typically the effective optical length of the cavity) on the order of a single (or at most a small number, e.g., 2 or 3) optical wavelength(s). It has been recognized that such resonators not only are interesting for fundamental research purposes but also hold technological promise for constructing novel kinds of light emitting devices. See, for instance, H. Yokoyama, *Science*, Vol. 256, pp. 66–70, which inter alia discloses a microcavity structure that contains a dye solution (FIG. 6). See also Y. Yamamoto et al., *Physics Today* pp. 66–73, June 1993. Possible applications of microresonator light emitting devices are, for instance, in the fields of flat panel displays, optical interconnects, optical fiber communications and LED printing.

At least some technological fields (e.g., color flat panel displays) require an array of light sources, some of which emit light of one color and some of another. Typically, such arrays are tri-color, e.g., red, green and blue, in order to achieve full color capability. In one exemplary known type of three-color flat panel display, an LED display, this is achieved through provision of three different types of LED. See, for instance, K. Murata, *Display Devices*, pp. 47–50, 1992, incorporated herein by reference.

Although the prior art knows flat panel LED color displays, the known LED displays are not entirely satisfactory, as evidenced by the fact that such displays are not yet widely used. For instance, prior art displays typically are difficult to manufacture. Thus, a new type of LED color display that is potentially easy to manufacture would be of considerable interest. This application inter alia discloses a novel multicolor array of light sources that can advantageously be used in, e.g., a color display that potentially can be more readily and economically manufactured than some prior art color displays.

It is known that a microcavity device that comprises an organic thin film sandwiched between two mirrors can have interesting optical properties. See, for instance, N. Takada et al., *Applied Physics Letters*, Vol. 63(15), pp. 2032–2034, and T. Nakayama et al., *Applied Physics Letters*, Vol. 63(5), pp. 594–595, Aug. 2, 1993. The latter inter alia discloses significant narrowing of the electroluminescence (EL) spectrum of a 50 nm thick tris (8-hydroxyquinolinol) aluminum (Alq) layer between two appropriately spaced mirrors, as compared to such a film that is not between two mirrors. (See FIG. 6 of the reference, which shows a large peak at 495 nm and a very small peak at 660 nm). The reference also discloses that the microcavity contained a triphenyl diamine derivative (TAD) hole transport layer and an indium tin oxide (ITO) transparent electrode layer.

SUMMARY OF THE INVENTION

The invention is embodied in an article that comprises a body that comprises a multiplicity (two or more) microcavity light emitters, with a given microcavity adapted for emission of radiation of a predetermined color (e.g., blue), and with the other adapted for emission of radiation of another predetermined color (e.g., red). Exemplarily the body comprises an array of emitters, with each basic element (pixel) of the array comprising respectively at least one emitter of red, one emitter of green and one emitter of blue radiation.

More specifically, the article comprises a layer structure on a major surface of a substrate body (e.g., a glass plate). The layer structure comprises spaced apart first and second reflector means and an active layer that comprises organic material capable of electroluminescence (e.g., Alq; such material will be referred to as "EL" material), with at least a first portion of the active layer disposed between the reflector means. The first and second reflector means define a first microcavity of effective optical length $L_1$. The layer structure further comprises means that facilitate application of an electric field across the first portion of the active layer such that the first microcavity can be caused to emit radiation of a first color.

Significantly, the layer structure further comprises spaced apart third and fourth reflector means, with a second portion of the active layer disposed between the third and fourth reflector means. The third and fourth reflector means define a second microcavity of effective optical length $L_2$ different from $L_1$ that is spaced apart from the first microcavity. The layer structure also comprises means that facilitate application of an electric field across the second portion of the active layer such that the second microcavity can be caused to emit radiation of a second color that differs from the first color.

Optionally the active layer can comprise, in addition to the organic EL material, one or more additional layers, e.g., a hole transport layer and/or an electron/hole blocking layer. The EL material can be single layer, or it can be two or more layers that differ in their emission characteristics.

A significant aspect of any embodiment of the invention is the presence, on a single substrate, of at least two microcavity light emitters that differ in their effective optical length. The difference in effective optical length can be attained in any of a variety of ways, and all of them are contemplated. For instance, any one of the layers within the first microcavity (e.g., the ITO electrode or the EL layer) could differ in thickness from the same layer within the second microcavity, including the case of one microcavity containing a layer that is absent in the other microcavity (e.g., a portion of a patterned ITO layer underlies the top reflector in one of the microcavities but not in the other). However, for reasons of manufacturability, the currently preferred embodiments comprise a "filler" layer that can readily be processed to have thickness $t_{f,1}$ in the first microcavity and $t_{f,2}$ in the second microcavity. (It will be understood that one of $t_{f,1}$ or $t_{f,2}$ could be zero.) With all other layers having essentially the same thickness in both microcavities, it can readily be seen that the effective optical lengths of the two microcavities will differ in consequence of the difference between $t_{f,1}$ and $t_{f,2}$.

FIG. I schematically shows the layer structure associated with a (bottom emitting) exemplary single microcavity according to the invention, wherein numeral 10 refers to the substrate, numerals 11–15 refer to the multilayer mirror, filler layer, transparent conductor, hole transport layer and EL layer, respectively, and numeral 16 refers to a portion of a patterned metal layer that serves as top electrode and as top reflector, and that defines the lateral extent of the microcavity. The lateral extent of region 16 will typically be much greater than (exemplarily at least 10 times) the effective optical length of the cavity.

In the bottom emitting configuration the substrate is substantially transparent to radiation of the relevant wavelength. By "substantially transparent" we mean herein that, over the relevant distance, the attenuation of radiation of the relevant wavelength is typically not more than 25%. Exemplary substrate materials are glass, sapphire, quartz, or transparent plastic such as poly(ethylsulfone).

The multilayer mirror consists of alternating layers of substantially non-absorbing materials of appropriately chosen thickness (typically $\lambda/4$). Such mirrors are well known. The reflectivity of the mirror depends in a known way on the number of layer pairs and the refractive index of the materials used. Exemplary material pairs are $SiO_2$ and $SiN_x$, and $SiO_2$ and $TiO_2$.

The (optional) filler layer can be any substantially transparent material that is chemically stable under the manufacturing and operating conditions that can be patterned by an appropriate technique. Exemplary filler materials are transparent polymers (e.g., polyimide) or transparent dielectrics (e.g., $SiO_2$).

The transparent (or semitransparent) conductor exemplarily is ITO or a conducting polymer such as polyaniline, or a thin layer (e.g., about 10 am) of metal (e.g., Au or Al).

The (optional) hole transport layer can be any substantially transparent material that can facilitate the transport of holes to the EL layer, where electron-hole recombination takes place. Examples of suitable materials are diamine (e.g., TAD) and poly(thienylene vinylene).

The EL layer is the source of the light emission. Exemplary EL materials are Alq, perylene derivatives, anthracene, poly(phenylene vinylenes), oxadiazole and stilbene derivatives. EL materials optionally can be doped, exemplarily with coumarine, a DCM, or a rhodamine derivative, in order to tailor the EL spectrum of the material and/or enhance the efficiency of the device.

An (optional) electron transport layer (not shown in FIG. 1) can be any substantially transparent material that can facilitate electron transport from the top electrode to the EL layer. Exemplary of such materials are 2-(4-Biphenyl)-5-phenyl-1, 3, 4-oxadiazole (PBD), butyl PBD, or either of these doped in an inert polymer such as poly(methyl methacrylate) (PMMA) or a poly(carbonate).

The patterned metal layer injects electrons into the adjacent layer. Exemplary materials are Al, Ag or Au, or alloys, e.g., MgAl.

Appropriate choice of EL material can make possible elimination of one (possibly both) of the hole transport layer and the electron transport layer. For instance, Alq can function both as EL material and electron transport medium, and poly(phenylene vinylene) can function both as EL material and hole transport medium.

It will be understood that it is possible to interchange the electron and hole injection contacts, such that electrons are injected from the transparent conductor layer and holes are injected from the patterned metal layer. If an electron transport layer and/or a hole transport layer are used, then their position in the layer structure is appropriately changed, e.g., interchanged.

Microcavities according to the invention can also be embodied in top-emitting structures. In such an emitter the substrate need not be transparent. It can be a metal (with an appropriate insulator provided) or a semiconductor, e.g., Si. FIG. 2 schematically shows an exemplary layer structure for a top-emitting microcavity, wherein numerals 20, 26 and 29 refer respectively to the substrate, the patterned metal layer and the (optional) electron transport layer, and numerals 25-21 refer, respectively, to the EL layer, (optional) hole transport layer, transparent conductor layer, (optional) filler layer, and multilayer mirror.

Some embodiments of the invention may also comprise a scattering layer that serves to randomize the emission over a large solid angle, thereby eliminating or at least reducing the angular dependence of the emission wavelength. This dependence, which is due to Fabry-Perot cavity effects, may be undesirable in some applications, e.g., for displays, and displays according to the invention will typically comprise such a layer. FIG. 2 illustrates a (top-emitting) embodiment that comprises scattering layer 28. In a bottom-emitting embodiment the scattering layer exemplarily is disposed between substrate and multi-layer mirror. Exemplarily, a contact layer is a substantially transparent polymer (e.g., polyimide or PMMA) with a colloidal dispersion (e.g., fumed silica) therein. It could also be a substantially transparent layer (e.g., $SiN_x$) with a mechanically rough surface.

Those skilled in the art will appreciate that embodiments of the invention typically will comprise a multiplicity (e.g., dozens or even thousands) of microcavities of one effective optical length that can be caused to emit radiation of a first color, and a multiplicity of microcavities of another effective optical length that can be caused to emit radiation of a different color. The embodiments will typically also comprise a multiplicity of microcavities of a third effective optical length that can be caused to emit radiation of wavelength of a third color. Exemplarily, the colors are red, green and blue.

In preferred embodiments, one of the reflector means of each of the at least two microcavities (e.g., the first and third reflector means, respectively) is a portion of a, typically uniform, planar multilayer mirror. The other of the reflector means (e.g., the second and fourth, respectively) typically is a portion of a patterned metal layer that typically also serves as electrode.

An article according to the invention typically comprises, in addition to the above described array of emissive elements, conventional components such as a power supply and drive circuitry.

In an exemplary and currently preferred embodiment, the article is a full color flat panel display comprising a multiplicity of pixels, with essentially each pixel comprising a red, a green and a blue microcavity emitter as described above. In other embodiments the article is a transmitter in optical interconnect means or in optical fiber communication means, or a print head in LED printing means. Such means will differ from the corresponding prior art means substantially only with respect to the light sources.

The drawings do not accurately show dimensions and/or proportions.

DETAILED DESCRIPTION OF A CURRENTLY PREFERRED EMBODIMENT

Figure 1:
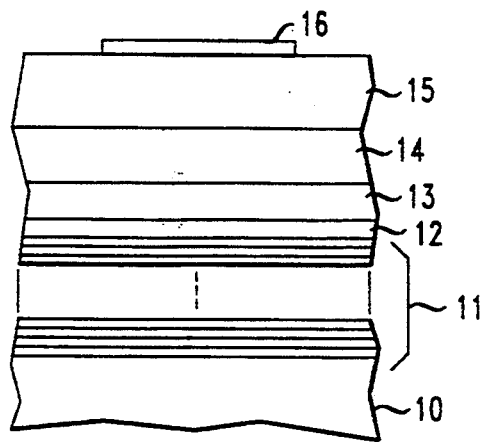
FIG. 1 schematically depicts the layer structure of an exemplary bottom-emitting microcavity according to the invention.
Figure 2:
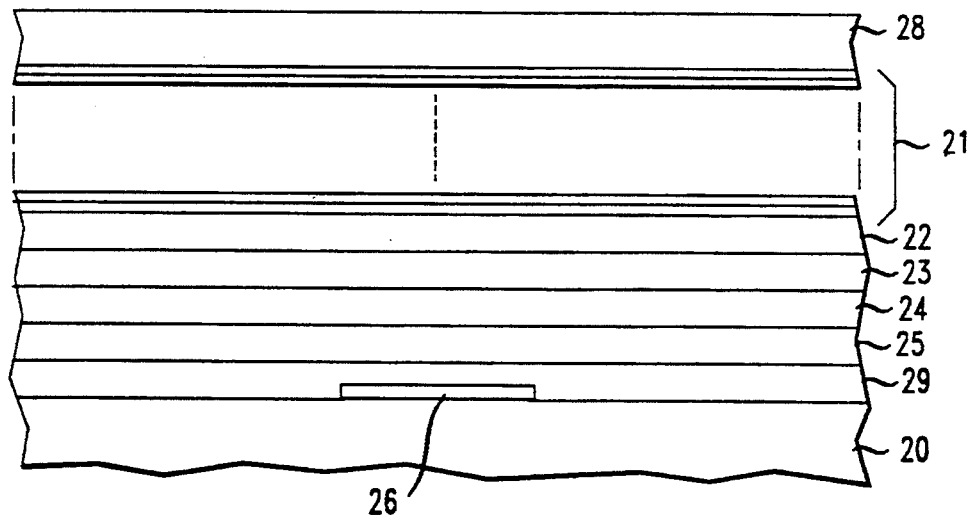
FIG. 2 schematically shows the layer structure of an exemplary top-emitting microcavity according to the invention.
Figure 3:
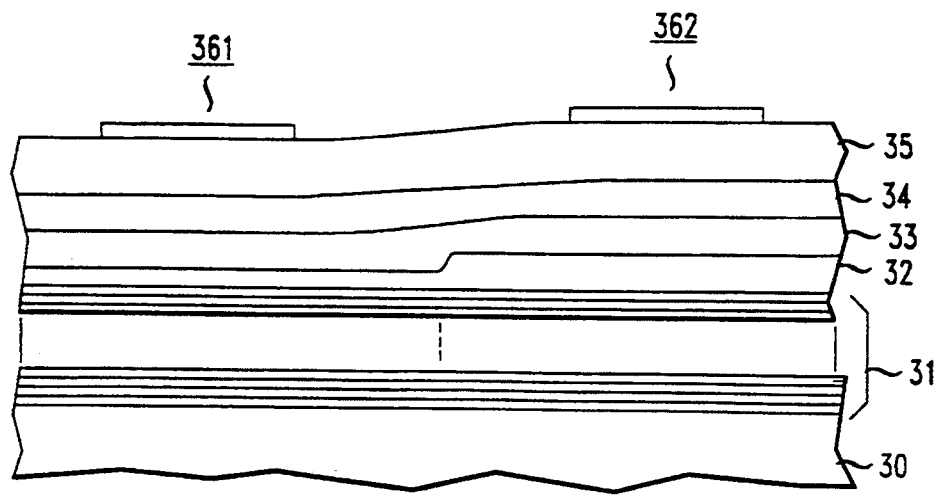
FIG. 3 schematically shows exemplary bottom-emitting first and second microcavities according to the invention.

FIG. 3 schematically illustrates a relevant portion of an exemplary embodiment of the invention. Numeral 30 refers to the substantially transparent substrate, e.g., a glass plate, and 31 refers to the plane mirror, typically a quarter wave stack of alternating dielectric layers (e.g., $SiO_2$ and $SiN_x$). Such mirrors are well known. The layer thicknesses typically are selected to result in peak reflectivity at a predetermined wavelength within the EL spectrum of EL material 35, exemplarily at the wavelength corresponding to the peak of the EL emission spectrum. Numeral 32 refers to the filler layer, 33 to the transparent conductor (e.g., ITO) layer, and 34 to the optional hole transport layer. Numerals 361 and 362 refer to portions of the patterned conductor (e.g., Al, Au) layer that serve to define, together with the plane mirror, a first and a second microcavity, respectively.

Exemplarily, the planar mirror consists of three $SiO_2/SiN_x$ pairs of nominal optical thickness 137 nm (refractive indices of 1.5 and 2.2, respectively), the stack having theoretical peak reflectivity 0.83. Planar mirrors having fewer or more layer pairs can be used. The maximum thickness of the filler layer typically is in the range 50–2000 nm, but may be larger if, for instance, the optical length of the cavity is more than a single wavelength. Those skilled in the art will appreciate that the filler layer may actually be absent in one of the two microcavities (i.e., the filler layer thickness may be zero in one of the two microcavities). Typically, a filler layer of essentially constant thickness is formed on the planar mirror, e.g., by spin coating and baking of polyimide, followed by patterning by appropriate means, e.g., photolithography and etching. The purpose of the patterning is to provide optical cavities differing in their optical thickness.

The total optical thickness L of a given cavity is given the following expression:

$$L = (\lambda/2)(n_{eff}/\Delta n) + \sum_i n_i L_i + (\phi_m \lambda/4\pi) \quad (1)$$

The first term in expression (1) is due to the effective penetration depth in the quarter wave stack (QWS), the second term is the sum of the optical thicknesses of the layers in the cavity, and the last term, usually small in comparison with the other two, is due to the phase shift at the top mirror. Parameter $\lambda$ is the wavelength, $n_{eff}$ is the effective refractive index of the QWS, $\Delta n$ is the index difference between the two materials that make up the QWS, $n_i$ and $L_i$ are the refractive index and actual thickness of the i'th layer in the cavity, and $\phi_m$ is the phase shift at the top mirror. The phase shift is given by $$\phi_m = \arctan[(2 n_s k_m) \cdot (n_s^2 - n_m^2 - k_m^2)^{-1}], \quad (2)$$

where $m_s$ is the refractive index of the material that is in contact with the top mirror, and $n_m$ and $k_m$ are the real and imaginary parts of the refractive index of the top mirror material.

As can be seen from equation 1, by changing for instance the thickness of the filler layer it is possible to change the optical length of the cavity, and thus change the wavelength of the resonance mode or modes of the cavity. Of course, at least in principle, the same effect can be achieved by changing the thickness of any of the other layers in the cavity, e.g., of the transparent conductor layer 12, of the optional hole transport layer 13, or of the EL layer 15, and all these possibilities are contemplated. However, for manufacturability reasons we currently prefer provision and selective thinning of an appropriate filler layer, since the latter operation is typically currently more readily controllable with filler materials such as polyimide or $SiO_2$ than it is with other layer materials, e.g. ITO, Alq or TAD.

A preferred application of microcavity emitters according to the invention is in full color flat panel displays. Each pixel of such a display will comprise at least three microcavities, one emitting red light, one emitting green light, and one emitting blue light. Any appropriate circuitry can be used to drive such a display. See, for instance, K. Murata, op. cit., which discloses at p. 49, FIG. 9a matrix driving circuit which could be used in a display according to the invention. Exemplarily, the transparent conductor (e.g., 33) is a substantially uniform layer of lateral extent at least approximately equal to the size of the display, or it is patterned into strips, a given strip associated with a given row (or column) of the display.

EXAMPLE 1

Figure 6:
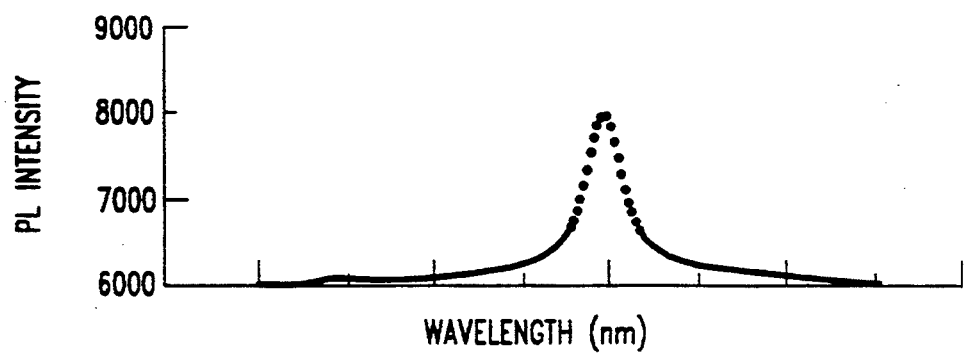
Figure 7:
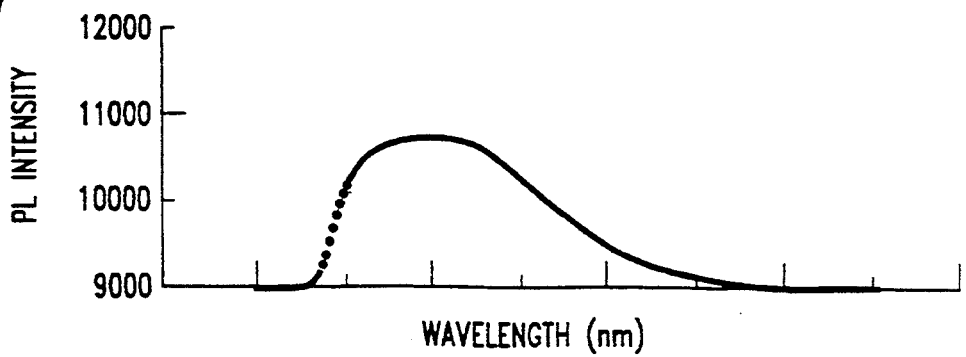

On a conventional fused silica substrate was formed a multilayer mirror by plasma enhanced chemical vapor deposition at 250° C. The mirror consisted of alternating layers of $SiO_2$ (refractive index 1.5, thickness 91.6 nm) and $SiN_x$ (refractive index 2.2, thickness 62.5 nm). A mixture of 2% silane in nitrogen and nitrous oxide was used for $SiO_2$ deposition, and a mixture of 2% silane in nitrogen was used for $SiN_x$ deposition. A 3-period stack was grown. The peak reflectivity was about 80–90% at 550 nm. The multilayer mirror was spin coated with a 108 nm layer of transparent polyimide (refractive index 1.7), followed by conventional baking. The thus produced uniform filler layer was patterned in an oxygen plasma to form terraces of different thicknesses (0, 45 and 108 nm). This was done by conventional means using photolithographically patterned photoresist as mask. This was followed by the vapor deposition of 60 nm Alq, 60 nm TAD, and 150 nm Al. All the evaporations were done in a conventional diffusion pumped thermal evaporator with a base pressure of about $10^{-6}$ Torr. The thus formed microcavities were designed such that the positions of the main mode in the three regions correspond to the three primary colors. For instance, in the regions with 0, 45 and 108 nm filler the cavity modes of interest are computed to be at 605, 493 and 546 nm, respectively (assuming a refractive index of 1.65 for the organics). Measured results are in good agreement with the computed results, as can be seen from FIGS. 4–6, which show, respectively, photoluminescence intensity (300 nm excitation) from cavities with 45, 108 and 0 nm filler thickness. FIG. 7 shows the corresponding intensity from an analogous sample without microcavity effects.

EXAMPLE 2

Figure 4:
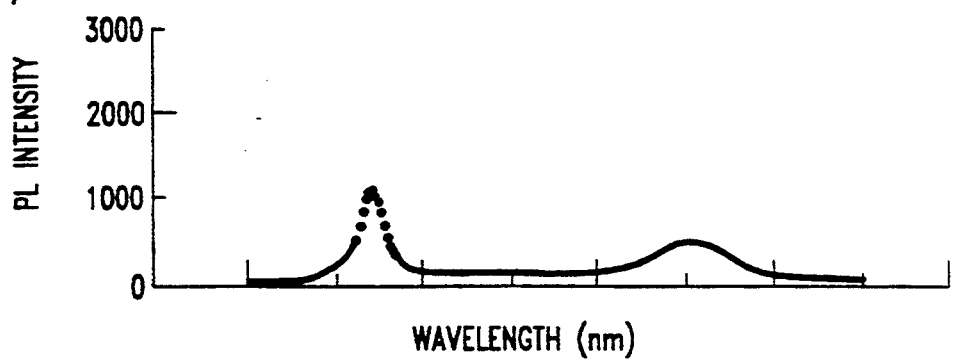
FIGS. 4–7 show exemplary emission spectra.
Figure 5:
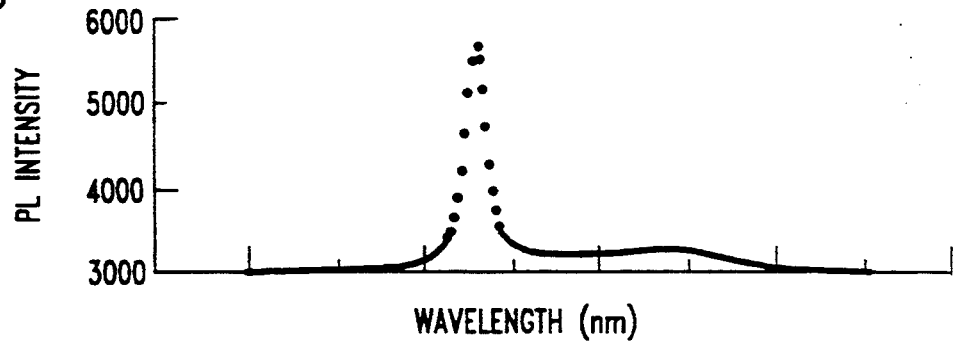

A layer structure is prepared substantially as described in Example 1 except that an approximately 60 nm thick ITO layer is deposited the filler layer, with the remainder of the layer sequence deposited on the thus formed transparent conductor layer, and that the Al layer is patterned to form separately addressable microcavity regions of different tiller thickness. Application of a voltage between top and bottom electrodes results in electroluminescence, with emissions substantially as shown in FIGS. 4–6.

We claim:

1. An article comprising a layer structure on a major surface of a substrate body, said layer structure comprising
   a) spaced apart first and second reflector means and an active layer that comprises organic material capable of electroluminescence, with at least a first portion of the active layer between said reflector means, said first and second reflector means defining a first microcavity of effective optical length $L_1$; and
   b) means that facilitate application of an electric field across the first portion of the active layer such that the first microcavity can be caused to emit radiation of a first color;
   CHARACTERIZED IN THAT the layer structure further comprises
   c) spaced apart third and fourth reflector means, with a second portion of the active layer between said third and fourth reflector means, said third and fourth reflector means defining a second microcavity of effective optical length $L_2$ different from $L_1$ and spaced apart from the first microcavity; and
   d) means that facilitate application of an electric field across the second portion of the active layer, such that the second microcavity can be caused to emit radiation of a second color different from the first color.

2. Article according to claim 1, wherein $L_1$ is approximately equal to one wavelength of the radiation of the first color in the microcavity.

3. Article according to claim 1, wherein each of said first and third reflector means is a portion of a unitary multilayer dielectric mirror, and each of said second and fourth reflector means is a separate portion of a patterned metal layer.

4. Article according to claim 1, wherein the layer structure comprises a filler material of thickness $t_{f,1}$ disposed between said first and second reflector means.

5. Article according to claim 4, wherein the layer structure further comprises filler material of thickness $t_{f,2} \neq t_{f,1}$ disposed between said third and fourth reflector means.

6. Article according to claim 1, wherein the layer structure further comprises a hole transport layer or an electron transport layer.

7. Article according to claim 3, wherein the layer structure further comprises a scattering layer disposed outside of said first and second microcavities.

8. Article according to claim 1, further comprising a third microcavity of effective optical length $L_3$ that differs from $L_2$ and $L_1$, said third microcavity being adapted for emission of radiation of a third color.

9. Article according to claim 1, wherein the article comprises a multiplicity of microcavities of effective optical length essentially equal to $L_1$, and a further multiplicity of microcavities of effective optical length essentially equal to $L_2$.

10. Article according to claim 9, wherein the article comprises a further multiplicity of microcavities of effective optical length essentially equal to $L_3$, said article being a tri-color display.

11. An article according to claim 3, wherein the organic material capable of electroluminescence is selected from the group consisting of Alq, perylene derivatives, anthracene, poly(phenylene vinylenes), oxadiazole or stilbene derivatives, and any of the foregoing doped with a dopant selected from the group consisting of coumarines, DCM, and rhodamine derivatives; wherein the multilayer dielectric mirror comprises alternating layers of $SiO_2$ and $SiN_x$, with x selected to give a refractive index of about 2.2, or $SiO_2$ and $TiO_2$; wherein the patterned metal layer comprises Al, Ag, Au, alloys of Mg and Ag, or alloys of Mg and Al; wherein said means for applying an electric field across said first and second portions of the active layer comprise indium tin oxide or polyaniline; and wherein the layer structure comprises a scattering layer disposed outside of said first and second microcavities.

12. An article according to claim 1, wherein the article is a flat panel display, optical interconnect means, optical fiber communication means, or LED printing means.

13. Article according to claim 6, wherein the layer structure comprises a hole transport layer and an electron transport layer.

* * * * *